(12) United States Patent
Gao

(10) Patent No.: US 11,810,938 B2
(45) Date of Patent: Nov. 7, 2023

(54) BACK-LIT IMAGE SENSOR BASED ON HETEROJUNCTION AND PREPARATION THEREOF

(71) Applicant: VISIONARY SEMICONDUCTOR INC., Ontario (CA)

(72) Inventor: Zhen Gao, Ontario (CA)

(73) Assignee: VISIONARY SEMICONDUCTOR INC., Waterloo (CA)

( * ) Notice: Subject to any disclaimer, the term of this patent is extended or adjusted under 35 U.S.C. 154(b) by 203 days.

(21) Appl. No.: 16/965,071

(22) PCT Filed: Jan. 2, 2019

(86) PCT No.: PCT/CN2019/070105
§ 371 (c)(1),
(2) Date: Jul. 27, 2020

(87) PCT Pub. No.: WO2019/149022
PCT Pub. Date: Aug. 8, 2019

(65) Prior Publication Data
US 2021/0111203 A1 Apr. 15, 2021

(30) Foreign Application Priority Data
Jan. 30, 2018 (CN) .......................... 201810089718.0

(51) Int. Cl.
*H01L 27/146* (2006.01)

(52) U.S. Cl.
CPC .... *H01L 27/1464* (2013.01); *H01L 27/14621* (2013.01); *H01L 27/14627* (2013.01);
(Continued)

(58) Field of Classification Search
CPC ......... H01L 27/14621; H01L 27/14627; H01L 27/14643; H01L 27/14685;
(Continued)

(56) References Cited

U.S. PATENT DOCUMENTS

| 7,875,948 B2 | 1/2011 | Hynecek et al. |
| 2010/0096718 A1* | 4/2010 | Hynecek ............. H01L 27/1464 |
| | | 257/460 |

(Continued)

FOREIGN PATENT DOCUMENTS

| CN | 102237380 A | 11/2011 |
| CN | 102237386 A | 11/2011 |

(Continued)

OTHER PUBLICATIONS

International Search Report based on related International Application No. PCT/CN2019/070105 dated Mar. 29, 2019.

*Primary Examiner* — Nelson Garces
(74) *Attorney, Agent, or Firm* — AIRD & MCBURNEY LP

(57) ABSTRACT

A back-lit image sensor and a method for manufacturing the back-lit image sensor; the back-lit image sensor comprises a photoreceptor portion and a circuit portion, wherein the photoreceptor portion comprises: a microlens and a light filter incident photons entering the back-lit image sensor first by means of the microlens and then passing through the light filter; a transparent conductive film, which is located below the microlens and the light filter, the incident photons continuing to enter by means of the transparent conductive film; and a first substrate, which is located below the transparent conductive film and which is used for capturing and detecting received photons; a heterojunction is formed between the transparent conductive film and the first substrate.

20 Claims, 10 Drawing Sheets

(52) U.S. Cl.
 CPC .. *H01L 27/14643* (2013.01); *H01L 27/14685* (2013.01); *H01L 27/14689* (2013.01)

(58) Field of Classification Search
 CPC ........... H01L 27/14689; H01L 27/1461; H01L 27/1463; H01L 27/14634; H01L 27/1462; H01L 21/70; H01L 27/14601; H01L 27/14683; H01L 27/1464
 See application file for complete search history.

(56) References Cited

U.S. PATENT DOCUMENTS

| | | | | |
|---|---|---|---|---|
| 2011/0241089 | A1* | 10/2011 | Ohri | H04N 5/37452 |
| | | | | 257/E31.085 |
| 2011/0266645 | A1* | 11/2011 | Chao | H01L 27/1464 |
| | | | | 257/E31.127 |
| 2012/0205730 | A1* | 8/2012 | Chen | H01L 27/1464 |
| | | | | 257/292 |
| 2016/0035769 | A1* | 2/2016 | Goden | H01L 27/14667 |
| | | | | 257/446 |
| 2017/0092777 | A1* | 3/2017 | Vielemeyer | H01L 29/402 |
| 2019/0157324 | A1* | 5/2019 | Watanabe | H01L 27/1463 |

FOREIGN PATENT DOCUMENTS

| | | |
|---|---|---|
| CN | 102637701 A | 8/2012 |
| CN | 2077719212 U | 8/2018 |
| CN | 109314124 A | 2/2019 |
| KR | 20110000896 A | 1/2011 |

\* cited by examiner

BACK-LIT IMAGE SENSOR BASED ON HETEROJUNCTION AND PREPARATION THEREOF

CROSS-REFERENCE TO RELATED APPLICATIONS

This application is a National Stage of International Application No. PCT/CN2019/070105 filed on Jan. 2, 2019, which is hereby incorporated by reference in its entirety.

FIELD OF THE TECHNIQUE

The present invention relates to a backside illuminated image sensors. More specifically, the present invention relates to a backside illuminated image sensors based on heterojunction photodetectors and a method for manufacture thereof.

BACKGROUND OF THE TECHNIQUE

CMOS image sensors are taking over the market of image sensors which has been dominated by CCD image sensors. To achieve higher resolutions with limited size of image sensors, the pixel size of CMOS image sensors shrinks, which makes the area ratio, fill factor, of the photodetection per pixel area rather critical. Low fill factor means that the metallic circuit on top of photodetectors reflect parts of photons and lose them before the photons reach the photodetectors, it affects the photosensitivity effect drastically in traditional image sensors, and therefore, high fill factor is necessary for high photoresponsivity. However, to reduce system noise and increase device speed, the circuits within each pixel needs to be more and more complicated and therefore low fill factor is inevitable for high speed and low noise CMOS image sensors. Therefore, it is rather difficult to have high speed, low noise CMOS image sensors with high sensitivity.

The solution in the prior art for the fill factor is BackSide Illuminated (BSI) image sensors. In the BSI image sensors, light enters the image sensor from the backside (that is, the side having the photodetector) of the image sensor while the circuits for pixel are kept at the front side of the image sensor. Therefore, the space competition on semiconductor surface between photodetector and pixel circuits is solved. Typically, backside illuminated image sensors comprise of, from the side of incoming light, photodetector part and electric circuit part, the photodetector part comprises of micro-lens, light filter, transparent conductive layer, first substrate, etc. and the electric circuit part comprises of basic components such as interlayer insulator layer, interlayer connector layer, etc.

For example, in the U.S. Pat. No. 7,875,948B2, light enters image sensor from the back side of image sensor and travel through the photodetector part first. In this US patent, it introduced a type of backside illuminated image sensor, comprise of: light receiving component disposed on the first substrate; interlayer insulating layer disposed on said first substrate that contain said light receiving component; alignment key that separate from the light receiving component and pass through the interlayer insulating layer and the first substrate; multiply interlayer connector layers in form of multi-layer structure disposed on the interlayer insulating layer, wherein the back side of the bottom interlayer connector layer is connected to the alignment key; a front passivation layer that covers the interlayer connector layer; a back side passivation layer disposed on the back side of the first substrate; a transparent conductive layer disposed on the back side passivation layer and connected to the alignment key; and color filter and microlens disposed at the surface of the transparent conductive layer to face light receiving component. Wherein, the first substrate comprises P type (the first conductivity type) conductivity material and is doped with P type ion impurities, while the light receiving component and source and drain electrodes are doped with N type (the second conductivity type) material, and therefore forming semiconductor PN junction, the PN junction makes the depletion region (the high-efficiency photogenerated carrier collection region) locate at the front side (the side close to the electric circuit part of the image sensor) of the image sensor.

However, in these BSI image sensors, for example in the image sensor described in U.S. Pat. No. 7,875,948B2, the junction of the photodetectors, mostly a semiconductor PN junction, is still located at the front side of the image sensor. Most visible light photons are absorbed in the first few micrometers of semiconductor (silicon), that means most photons are absorbed close to the backside of the image sensors. After photons are absorbed, carriers are generated (photoelectric effect) for collection of the device. The highest collection efficiency for carriers happens where the junction is located and its vicinity. Consequently, the region of the highest carrier collection efficiency does not spatially overlap with the region where the highest (or most) photon absorption and photoelectric effect occur. Therefore, the overall photoresponsivity of the BSI image sensors are not optimized. To make the region where photon absorption and most of the photoelectric effect occur closer to the high efficiency carrier collection region, the BSI image sensors are usually made very thin from several to a few tens of micrometers in thickness. One way to achieve very thin image sensors is to etch a portion of the semiconductor (silicon) substrate material from the back side using chemical methods, mechanical methods or a combination of chemical and mechanical methods. This is a very delicate and difficult procedure often resulting in low production yield and high fabrication difficulty and cost. Another way to achieve very thin image sensor is to use a special Silicon-On-Insulator (SOI) substrates, which are typically much more expensive than conventional silicon substrates.

Moreover, although CMOS image sensor has gone through dramatic improvement over the last few years, the key component, photodetector, is still using the most traditional silicon-based PN junction photodetector. One reason is that the traditional silicon-based PN junction photodetector can be achieved by the same fabrication process as for the pixel circuits; another reason is that the photodetector is not the bottle neck that affects the CMOS image sensor performance in the past. However, as the pixel circuit and CMOS fabrication technology develop rapidly, the traditional silicon-based PN junction photodetector shows disadvantage both on fabrication process requirement and the performance. Traditional silicon-based PN junction photodetector requires to be formed at high temperature (mostly above 900° C.). High temperature process steps may seriously affect minority carrier lifetime at the photosensitive area and therefore affect the quantum conversion efficiency of the photodetector. Furthermore, because high temperature process causes the photodetector and pixel circuit to be required to fabricate at the same time, the fabrication processes for the two components of the device cannot be optimized pointedly and respectively, and the fabrication processes constrain with each other, therefore the performance of the device is not truly optimized. The current CMOS technology is getting more and more mature, reaching 10 nm technology node, while the optimized CMOS technology cannot directly used in the fabrication (often using 60 nm or even 90 nm technology nodes) of image sensor. One of the most important reason is that fabrication process for the most important part of the image sensor (i.e. the fabrication process of the photodetector) seriously restricts the fabrication of the pixel circuits.

Accordingly, it is desired to provide a type of image sensor that can benefit from high fill factor of the BSI image sensor and achieving high photosensitivity with simple and inexpensive fabrication processes.

SUMMARY OF THE INVENTION

The purpose of present invention is to provide a backside illuminated image sensor based on heterojunction photodetectors that are formed by transparent conductive layer and silicon substrate.

The novel silicon-based heterojunction photodetector still uses a silicon wafer as a substrate, and a thin film deposited at low temperature forms a depletion region at the heterojunction interface, therefore helping to collect free carriers generated by photogenerated conversion and form photoelectric signal. The nature of low temperature manufacturing reduces high temperature manufacturing processes at first; more importantly, the structure and low manufacture temperature characters of the heterojunction photodetector enable that the photodetector to be manufactured in the end after the manufacturing of the CMOS electric circuit, and the manufacture of the photodetector does not affect the finished CMOS electric circuit part. Therefore, the strong restrictions for pixel circuit design are removed.

The combination of the backside illuminated image sensor and the novel heterojunction photodetector almost perfectly solves the typical defects of backside illuminated image sensors. First, the combinate backside illuminated image sensor structure preserves the advantages of fill factor close to 100%; Second, the region with high efficiency light absorption and the region with high efficiency collection of free carrier become overlapped at the back side. Therefore, this eliminates the need for the substrate etching process, reduces process threshold and avoids the utilization of expensive special substrate SOI.

The purposes and advantages of the present invention are achieved through the following approaches:

The present invention provides a backside illuminated image sensor. The backside illuminated image sensor comprised of a photodetector part and an electric circuit part, wherein the photodetector part comprised of microlens and light filter, incoming photons travel through the microlens and then through the light filter, after selective filtering, entering into the backside illuminated image sensor; a transparent conductive layer, the transparent conductive layer is positioned beneath the microlens and the light filter, the incoming photons continue to travel through the transparent conductive layer; and the first substrate, the first substrate is positioned beneath the transparent conductive layer, and is able to capture and detect the received photons, wherein the transparent conductive layer and the first substrate form heterojunction.

In preferred embodiments, the photodetector part further comprised of a passivation layer, which is positioned between the transparent conductive layer and the first substrate, at the back side of the first substrate.

In preferred embodiments, the passivation layer is formed to have a thickness of 0.5 nm to 10 nm, and in preferred embodiments, the passivation layer is formed to have a thickness of 2 nm to 3 nm.

In some embodiments, the thickness of the passivation layer is 10 nm to 500 nm; in preferred embodiments, the thickness of the passivation layer is 50 to 100 nm.

In an implementation, the passivation layer with 10 nm to 500 nm thickness has lower noise comparing to the passivation layer with 0.5 nm to 10 nm thickness, while the passivation layer with 0.5 nm to 10 nm thickness provides better quantum conversion efficiency, response speed, etc. comparing to the passivation layer with 10 nm to 500 nm thickness. Therefore, in different application scenarios, the thickness of passivation layer can be optimized in different ways according to different needs.

In preferred embodiments, the passivation layer is formed to be conductive. The material of the passivation layer may be insulator, the passivation layer may be non-conductive horizontally, however, conductive vertically, through tunneling effect, structural defects and other mechanisms.

In preferred embodiments, the passivation layer can be formed by wide bandgap material, narrow bandgap material, bandgap engineered material, crystalline material, amorphous material, micro-structured material, nano-structured material, intrinsic material, hybrid material, alloy material, doped material, etc.

In preferred embodiments, the first substrate is lightly doped N-type silicon substrate.

In preferred embodiments, the substrate has a thickness of 2 μm to 200 μm. In preferred embodiments, the substrate has a thickness of 20 μm to 80 μm.

In preferred embodiments, the transparent conductive layer can serve as an Anti-Reflection Coating (ARC) layer to selectively reduce the reflection of incoming photons with one or more predetermined wavelengths.

In preferred embodiments, the transparent conductive layer can be formed by materials selected from a group consisting of Indium Tin Oxide (ITO), Zinc Oxide (ZnO), doped Zinc Oxide (doped ZnO), Indium Oxide ($In_2O_3$), Tin Oxide ($SnO_2$).

In preferred embodiments, the transparent conductive layer is formed to have a thickness of approximately 10 nm to 500 nm, in preferred embodiments, the transparent conductive layer is formed to have a thickness of approximately 80 nm.

In preferred embodiments, the photodetector part comprised of additional Anti-Reflection Coating (ARC) layers, and the transparent conductive layer can work together with these ARC layers to selectively reduce the reflection of incoming photons with one or more predetermined wavelengths.

In preferred embodiments, the electric circuit part of the backside illuminated image sensor comprises a back surface field, the back surface field is positioned at the first surface of the first substrate which is at the opposite position of the second surface of the first substrate, and the back surface field is a heavily doped region, and the back surface field has the same doping type, N type or P type, as the first substrate.

The present invention provides a method of manufacturing a backside illuminated image sensor, comprising the steps of:

providing a first substrate;

forming the electric circuit part of the backside illuminated image sensor on the first substrate;

forming the photodetector part of the backside illuminated image sensor on the first substrate, wherein the manufacturing of the photodetector part comprising:
  forming a transparent conductive layer on the first substrate;
  forming a light filter and microlens on the transparent conductive layer;
  wherein forming a heterojunction between the transparent conductive layer and the first substrate.

In preferred embodiments, a passivation layer is formed on the first substrate, prior to forming the transparent conductive layer, wherein the passivation layer is positioned between the transparent conductive layer and first the substrate, at the second surface of the first substrate.

In preferred embodiments, the passivation layer is formed to have a thickness of 0.5 nm to 10 nm, in preferred embodiments, the passivation layer is formed to have a thickness of 2 nm to 3 nm.

In other embodiments, the passivation layer is formed to have a thickness of 10 nm to 500 nm; in preferred embodiments, the passivation layer is formed to have a thickness of 50 nm to 100 nm.

In an implementation, the passivation layer with 10 nm to 500 nm thickness has lower noise comparing to the passivation layer with 0.5 nm to 10 nm thickness, while the passivation layer with 0.5 nm to 10 nm thickness provides better quantum conversion efficiency, response speed, etc. comparing to the passivation layer with 10 nm to 500 nm thickness. Therefore, in different application scenarios, the thickness of passivation layer can be optimized in different ways according to different needs.

In preferred embodiments, the passivation layer is formed to be conductive. The material of the passivation layer may be insulator. The passivation layer may be non-conductive horizontally, however, conductive vertically, through tunneling effect, structural defects and other mechanisms.

In preferred embodiments, wherein the passivation layer is formed by wide bandgap material, narrow bandgap material, bandgap engineered material, crystalline material, amorphous material, micro-structured material, nano-structured material, intrinsic material, hybrid material, alloy material, doped material.

In preferred embodiments, the first substrate is lightly doped N-type silicon substrate.

In preferred embodiments, the first substrate has a thickness of 2 μm to 200 μm. In preferred embodiments, the first substrate has a thickness of 20 μm to 80 μm.

In preferred embodiments, the transparent conductive layer can serve as an Anti-Reflection Coating (ARC) layer to selectively reduce the reflection of incoming photons with one or more selective wavelengths.

In preferred embodiments, wherein the transparent conductive layer (130) is formed by materials selected from a group consisting of Indium Tin Oxide (ITO), Zinc Oxide (ZnO), doped Zinc Oxide (doped ZnO), Indium Oxide ($In_2O_3$), Tin Oxide ($SnO_2$).

In preferred embodiments, the transparent conductive layer is formed to have a thickness of 10 nm to 500 nm. In preferred embodiments, the transparent conductive layer is formed to have a thickness of 80 nm.

In preferred embodiments, the photodetector part comprised of other Anti-Reflection Coating (ARC) layers, and the transparent conductive layer can work together with these ARC layers to selectively reduce the reflection of incoming photons with one or more selective wavelengths.

In preferred embodiments, the manufacture of the photodetector part is performed below 250° C.

In preferred embodiments, during the manufacture of the electric circuit part, the method further comprises: forming the back surface field at the first surface of the first substrate which is at die opposite position of the second surface of the first substrate, and the back surface passivation field is a heavily doped region, and the back surface field has the same doping type, N type or P type, as the first substrate.

Based on the above narrative, the heterojunction of the backside illuminated image sensor in the present invention locates at the opposite side of pixel control and readout circuit, therefore, the formed depletion region (the high-efficiency photogenerated carrier collection region) is located on the back side that is the different surface from the electric circuits, and is overlapped at the back side of the first substrate with the high efficiency photon absorption region, high efficiency photon absorption region is adjacent to the transparent conductive layer.

In the present invention, the transparent conductive layer is a part of the heterojunction, and has the reflection or anti-reflection function. The thickness of the transparent conductive layer may be designed according to the refractive index of itself and the first substrate, and the special wavelength of the target lights in order to minimize the reflection of those target lights to play an anti-reflection role. Similar designs may also be applied to reflection function in order to reject the entry of some target lights. It is different from traditional P-N junction photodetector based backside illuminated image sensor that requires additional optical layer or component (such as the back side passivation layer 125 playing an anti-reflection role, as described in U.S. Pat. No. 7,875,948) to introduce the anti-reflection function.

In some embodiments, the transparent conductive layer is designed as single layer Anti-Reflection Coating (ARC) layer by means of a simple thickness design to achieve the anti-reflection function, so that a separate step is no required to manufacture the Anti-Reflection Coating (ARC) layer, which simplifies the manufacturing process for the Anti-Reflection Coating (ARC) layer. In other embodiments, the transparent conductive layer serves as one layer of a multi-layer Anti-Reflection Coating (ARC) layer and perform anti-reflection function together with other anti-reflection layers to simplify manufacturing process for the Anti-Reflection Coating (ARC) layer.

In the present invention, the back-surface passivation field is heavily doped (for example, about $1 \times 10^{18-20}$ $cm^{-3}$) region with the same doping type of the first substrate. The back-surface passivation field is a potential well to help collect photoelectric signal and reduce the recombination of photogenerated carriers at the front surface.

In the method of manufacturing mentioned in the present invention, what is worth emphasis is that in traditional PN junction photodetector based backside illuminated image sensor, the PN junction photodetector creates a depletion region (the high-efficiency photogenerated carrier collection region), and the depletion region is not overlapped with the high efficiency photon absorption region that is adjacent to the transparent conductive layer, thus the substrate etching process or the utilization of special substrate (such as Silicon on insulator (SQL) substrate) are necessary so that the high efficiency photon absorption region and the depletion region can come close or even overlap partly. The first substrate thickness after etching in the prior art is typically below 10 μm, in some cases 2 μm to 3 μm, so that the high efficiency photon absorption region and the depletion region (the high-efficiency photogenerated carrier collection region) can overlap. However, the substrate etching process is very difficult with a very low yield. Under the same tolerance, the low substrate thickness amplifies the performance difference caused by the tolerance; the utilization of specific substrate is expensive.

To improve the issues mentioned above, a backside illuminated image sensor based on heterojunction photodetector is adapted in the present invention, wherein the heterojunction is formed by a transparent conductive layer and the first substrate (such as N type silicon substrate), and then the depletion region formed to help the collection of photoelectric signals is located at the back side that is the different surface from the electric circuits and overlaps with the high efficiency photon absorption region. Therefore, in embodiments of the present invention, the first substrate does not require substrate etching process or only require slight substrate etching process, which reduces difficulty of manufacture and improves production yield. In the meantime, the overlap between high efficiency photon absorption region and depletion region (the high-efficiency photogenerated carrier collection region) can improve quantum conversion efficiency to a certain extent.

Moreover, the first substrate with a certain thickness can also reduce noise caused by semiconductor surface defects and facilitate light absorption. If the substrate thickness is very thin (for example below 10 μm in the prior art or even 2 μm to 3 μm), the absorption of near infrared light with a longer wavelength is strongly affected, therefore this kind of the image sensor suffers from very low sensitivity for near infrared light, this is because the penetration depth of near infrared light is much longer than that of visible light, most of near infrared photons penetrate through the photosensitive region and cannot be captured. For example, the penetration depth in the silicon substrate for near infrared light with 940 nm wavelength is approximately 100 μm. In some circumstance, for example choosing the substrate thickness of 100 μm, the substrate etching process can be eliminated, thus the first substrate that has not been etched will have better absorption of near-infrared light with a fixed wavelength. In typical cases, as for near-infrared light with 860 nm, the substrate thickness after etching process is preferred to be approximately 20 μm to 80 μm.

In order to improve the optical anti-reflection property for the different targeted wavelength light, it can be achieved by adjusting the thickness of the transparent conductive layer (i.e. transparent conductive layer not only forms the heterojunction photodetector, but also realizes or assists the realization of the function of Anti-Reflection Coating layer). The thickness of the transparent conductive layer is about 10 nm to 500 nm, for example about 20 nm, 50 nm, 80 nm, 100 nm, 200 nm, 500 nm. A preferred thickness is 80 nm, targeting 600 nm visible red light. The thickness is designed based on the refractive index of the transparent conductive layer and the targeted light wavelength.

It should be noted that the transparent conductive layer can serve as single layer Anti-Reflection Coating layer to achieve anti-reflection function, and therefore simplifying the manufacturing process for Anti-Reflection Coating layer, eliminating the step of manufacturing Anti-Reflection Coating layer separately in the prior art. In other embodiment, the transparent conductive layer can serve as one layer of multi-layer Anti-Reflection Coating layer to achieve the anti-reflection property with other Anti-Reflection Coating layer.

In comparison to prior art, because the PN junction in the prior art is formed through high temperature process, the electric circuit and the photodetector have to be manufactured together at the same time, otherwise, the high temperature manufacture process of the PN junction will change the finished electric circuit part, thus the manufacture process of the electric circuit and the photodetector cannot be optimized separately. While the formation of the heterojunction in the present invention can be manufactured through low temperature (below 250° C.) process, therefore the manufacture of the heterojunction does not affect the finished electric circuit part, as a result of that, the photodetector can be manufactured after the electric circuit part is optimized and manufactured so that the photodetector and the electric circuit process can both be optimized separately. That is to say, in the embodiments, the photodetector can be manufactured last, after the manufacture and optimization of the electric circuit part, because the low temperature fabrication process of the heterojunction does not affect the finished electric circuit part.

In the prior art, some backside illuminated image sensor manufacture passivation layer on the back surface, anti-reflection coating layer and transparent conductive layer to apply a back side reverse bias voltage, thereby reducing the free carrier recombination at the back side and improving quantum conversion efficiency. The structure of the present embodiment seems to be similar to this structure, but the actual structure and application purpose are significantly different. First, in terms of the property of the passivation layer, the passivation layer in the prior art is insulative, and provides capacitance; the passivation layer achieves surface recombination reduction through repelling the minority carriers. In comparison, the passivation layer of this structure in the present invention is conductive through tunneling current and other mechanisms. Second, in terms of the thickness of the passivation layer, the thickness of the passivation layer in the prior art is several hundreds of nanometers to several micrometers, in comparison, the passivation layer in the present invention, is several nanometers to several hundreds of nanometers. In some embodiments, the thickness of the passivation layer is about 0.5 nm to 10 nm. In preferred embodiments, the thickness of the passivation layer is about 2 nm to 3 nm. The passivation layer in the present invention has the ultra-thin and tunneling property, and such type of passivation layer can improve the overall performance of the backside illuminated image sensor, help increase the quantum conversion efficiency and photoresponsivity of the photodetector. In other embodiments, the thickness of the passivation is about 10 nm to 500 nm. In preferred embodiments, the thickness of the passivation layer is about 50 nm to 100 nm. In an implementation, the passivation layer with 10 nm to 500 nm thickness has lower noise comparing to the passivation layer with 0.5 nm to 10 nm thickness, while the passivation layer with 0.5 nm to 10 nm thickness provides better quantum conversion efficiency, response speed, etc. comparing to the passivation layer with 10 nm to 500 nm thickness. Therefore, in different application scenarios, the thickness of passivation layer can be optimized in different ways according to different needs.

DESCRIPTION OF SPECIFIC EMBODIMENTS

Figure 1:
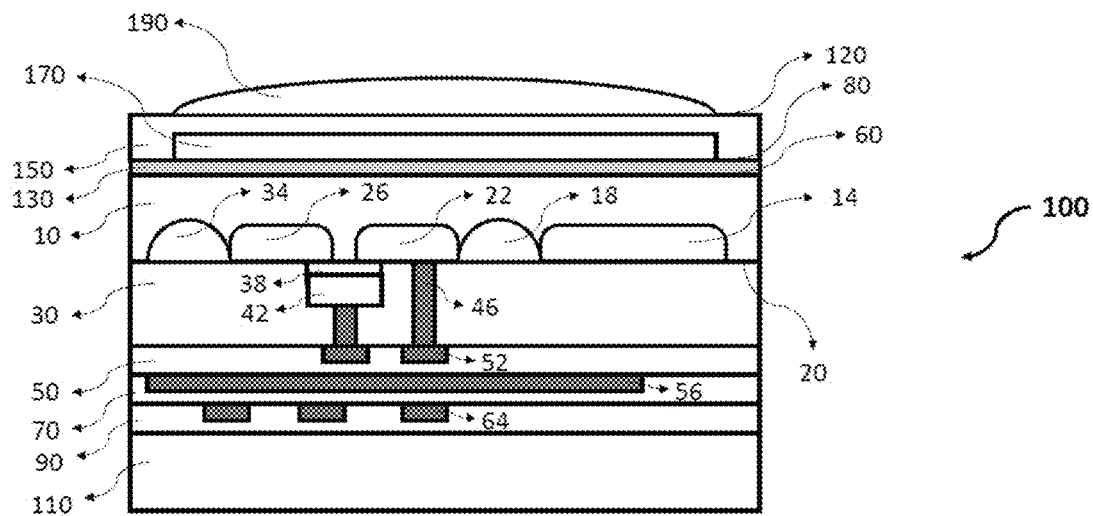
FIG. 1 is a cross-sectional view illustrating a backside illuminated image sensor in accordance with a first embodiment of the present invention.

Embodiments of the present invention relate to a backside illuminated image sensor and a method of manufacturing a back side illuminated image sensor. Specifically, embodiments of the present invention relate to a heterojunction photodetector based backside illuminated image sensor and a method of manufacturing a heterojunction photodetector based backside illuminated image sensor.

Referring to the drawings, the same or similar elements in different figures have been designated with the same or like reference numerals throughout the various embodiments of the present invention.

Since the present invention relates to a heterojunction photodetector based backside illuminated image sensor, the structure of the electric circuit part of the backside illuminated image sensor can basically adopt the known circuit structure and manufacturing process of existing technology in the art (for example, U.S. Pat. No. 7,875,948 B2), in the following embodiments, the present invention only focuses on the differences and improvements of the electric circuit part from the prior art.

Since the present invention relates to a heterojunction photodetector based backside illuminated image sensor, that is to say the present invention relates to and proposes for the first time the application of a heterojunction photodetector in a backside illuminated image sensor, so in the following embodiments, the present invention focuses on the application of heterojunction photodetectors in backside illuminated image sensors, the structure and manufacture method of the backside illuminated image sensors.

FIG. 1 is a cross-sectional view illustrating a backside illuminated image sensor in accordance with a first embodiment of the present invention, wherein the reference numeral "100" denotes a pixel unit of the heterojunction photodetector based backside illuminated image sensor. In this embodiment, referring to FIG. 1, the pixel unit 100 comprises, in the order of from top to bottom, a microlens 190; a smoothing layer 150 (for smoothing the surface and facilitating the manufacture of microlens); a light filter 170, which disposed in the smoothing layer 150; a transparent conductive layer 130; a first substrate 10; the first to fourth insulating interlayers 30, 50, 70, 90; and a second substrate 110. Wherein, the second substrate 110 may be an inexpensive N-type or P-type silicon substrate or glass substrate. In this embodiment, a P-type silicon substrate is used. In the first substrate 10, a back surface field 14, a first insulation layer 18, source and drain electrodes 22, 26 of a transistor in the pixel control and reading circuit, and a second isolation layer 34 are disposed in the order of from right to left. These parts are bonded to the first surface 20 of the first substrate 10 (that is, the front surface of the first substrate 10 bonded to the first insulating interlayer). A gate insulating layer 38 and a gate conductive layer 42 of a transistor in the pixel control and readout circuit are disposed in the first insulating interlayer. In addition, conductive interlayers 46, 52, 56, 64 are disposed in the first to fourth insulating interlayers 30, 50, 70, and 90, respectively.

It should be noted here that, this embodiment only exemplarily presents the components of the electric circuit part for simplicity considerations. In actual implementations or other embodiments, the electric circuit part may have different settings according to actual needs (for example, the electric circuit part comprises different number of insulating interlayers, conductive interlayers, etc.). The electric circuit part may also comprise of other components commonly used in the prior art according to actual needs, such as the alignment keys in U.S. Pat. No. 7,875,948B2.

In the embodiment shown in FIG. 1, except for the transparent conductive layer 130, the first substrate 10, and the back surface field 14, the implementation of other related components can be accomplished using conventional technologies well-known in the art, such as U.S. Pat. No. 7,875,948 B2 introduced in the background of the invention.

In the present embodiment, the transparent conductive layer 130, the first substrate 10, and the back surface field 14 are disposed as follows: the transparent conductive layer 130 is disposed at the back side of the first substrate 10, wherein a heterojunction is formed between the transparent conductive layer 130 and the first substrate 10. The back surface field 14 is disposed at the first surface 20 (that is the front surface) of the first substrate 10.

The formed heterojunction is located on the opposite side of the pixel control and reading circuit, that is, on the same side as the light incident region. The first substrate 10 may be an N-type or P-type silicon substrate (or SOI substrate). In this embodiment, the first substrate 10 is an N-type silicon substrate and is lightly doped (for example, about $1\times10^{13\text{-}15}$ cm$^{-3}$). In addition, in this embodiment, the photodetector structure of the backside illuminated image sensor is a silicon-based heterojunction, that is, heterojunction is formed by an N-type silicon substrate (i.e. the first substrate 10) and an N-type transparent conductive layer 130. It should be emphasized that in the heterojunction of other embodiments, the first substrate 10 and the transparent conductive layer 130 may have the same or different conductivity types (for example, N-type or P-type).

Since the present invention relates to a heterojunction photodetector based backside illuminated image sensor, it is different from prior art where during (or before, or after) manufacturing the electric circuit part, the light receiving region at the same surface of electric circuit part is typically doped with the different conductivity type from that of the substrate to form a PN junction (such as the PN junction used in U.S. Pat. No. 7,875,948B2). In comparison, in the present invention, the light receiving region at the same surface of electric circuit part is doped with the same conductivity type as that of the substrate to form a N-N+ high-low junction back surface field. In addition, the PN junction in the prior art is located on the same side of pixel control and readout circuit, while in this embodiment, the heterojunction is located on the opposite side of pixel control and readout circuit.

When the transparent conductive layer 130 is disposed on the first substrate 10, a depletion region (the high-efficiency photogenerated carrier collection region) is formed. It should be emphasized that the depletion region that helps the collection of photoelectric signal is located at the back side that is a different surface from where the electric circuit part is located. The depletion region is provided by the heterojunction photodetector formed between the transparent conductive layer 130 and the N type silicon substrate 10. Therefore, the formed depletion region (the high-efficiency photogenerated carrier collection region) and the high efficiency photon absorption region (which is adjacent to the transparent conductive layer 130) overlap at the back side of the first substrate 10.

In this embodiment, the transparent conductive layer 130, as part of the heterojunction, may also achieve the reflection or anti-reflection function. The thickness of the transparent conductive layer 130 can be designed according to the refractive index of the transparent conductive layer 130, the refractive index of the first substrate 10, and the specific wavelength of the target light in order to reduce the reflection of target light and thus play an anti-reflection role. Similar designs may also be used to the reflection function in order to reject the entry of some target light. It is different from traditional P-N junction photodetector based backside illuminated image sensor that requires additional optical layer or component (such as the back side passivation layer 125 playing an anti-reflection role, as described in U.S. Pat. No. 7,875,948B2) to introduce the anti-reflection function.

In the present embodiment, the transparent conductive layer 130 is designed as single layer Anti-Reflection Coating (ARC) layer by means of a simple thickness design to achieve the anti-reflection function, so that a separate step is no required to manufacture the Anti-Reflection Coating (ARC) layer, which simplifies the manufacturing process for the Anti-Reflection Coating (ARC) layer. In other embodiments, the transparent conductive layer 130 serves as one layer of a multi-layer Anti-Reflection Coating (ARC) layer and perform anti-reflection function together with other Anti-Reflection Coating (ARC) layer to simplify the manufacturing process for the Anti-Reflection Coating (ARC) layer.

In the present embodiment, the back-surface passivation field 14 that is at the first surface 20 of the first substrate 10, is heavily doped (for example, about $1 \times 10^{18-20}$ $cm_{-3}$) region with the same doping type of the first substrate 10. The back-surface passivation field is a potential well to help collect photoelectric signal and reduce the recombination of photogenerated carriers at the first surface 20.

Figure 2A:
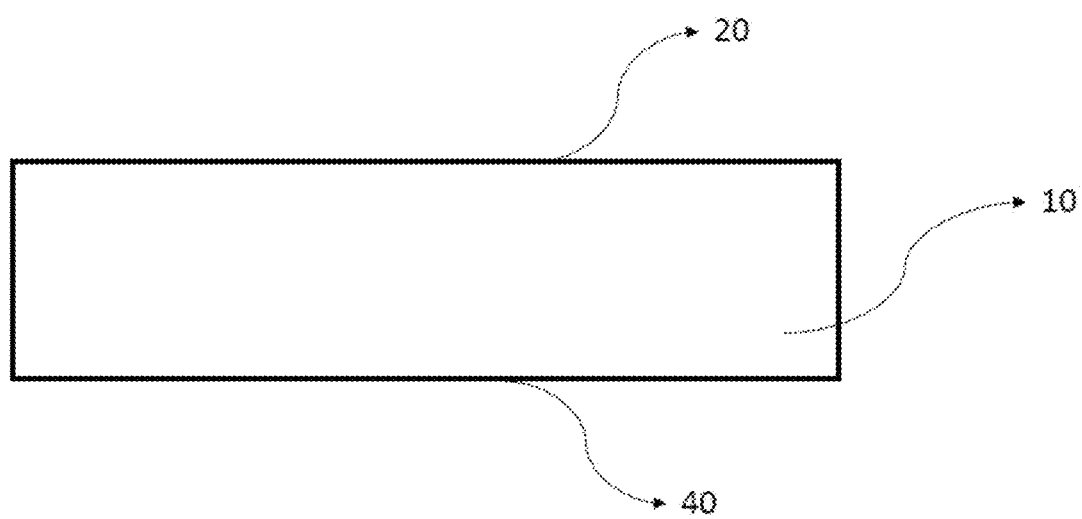
FIGS. 2a to 2i illustrates a method of manufacturing a backside illuminated image sensor in accordance with the first embodiment of the present invention.
Figure 2B:
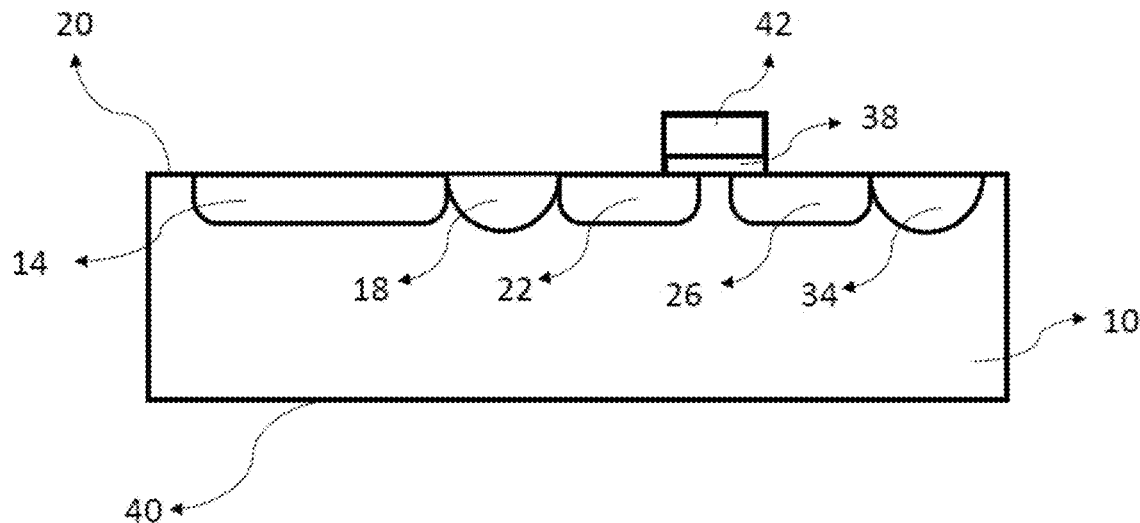
Figure 2C:
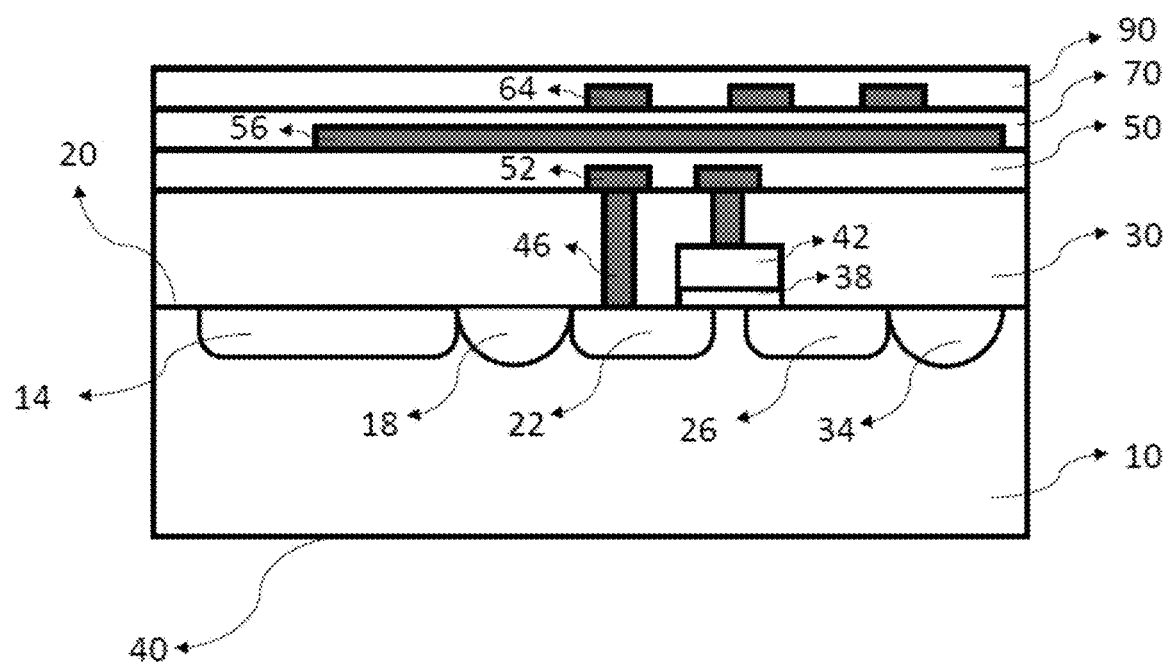

The pixel unit 100 of the backside illuminated image sensor illustrated in FIG. 1 can be manufactured by the following steps illustrated in FIGS. 2a to 2i:

FIG. 2a illustrates the first substrate 10 at the beginning of the manufacturing process, the first substrate 10 has a first surface 20 (that is the front surface of the first substrate 10) of the first substrate 10 and an original second surface 40 (that is the original back surface of the first substrate 10). Based on the first substrate 10 (lightly doped N-type silicon substrate), first, through the techniques well-known in the art (including photolithography, ion implantation, doping, annealing, etching, passivation layer deposition, oxidation, etc.) to realize the preparation of the pixel array and the circuits within the pixels, and complete the steps illustrated in FIGS. 2b to 2d. The process includes the formation of: as illustrated in FIG. 2b, the first isolation layer 18, the source and drain electrodes 22, 26 of the transistors in the pixel control and readout circuit and the second isolation layer 34 in the first substrate 10; as illustrated in FIG. 2c, the gate insulating layer 38 and the gate conducting layer 42 of the transistors in the pixel control and readout circuits in the first insulating interlayer and the conductive interlayers 46, 52, 56, 64 that are disposed in the first to fourth insulating interlayers 30, 50, 70, and 90, respectively; as illustrated in FIG. 2d, the second substrate 110 (P type silicon substrate in the present embodiment) adjacent to the fourth insulating interlayer 90.

The present invention is different from prior art where during (or before, or after) manufacturing the electric circuit, the light receiving region at the same surface of electric circuit is doped with the different conductivity type from that of the substrate to form a PN junction. In the present invention, the light receiving region at the same surface of electric circuit is doped with the same conductivity type as that of the substrate to form a N-N+ high-low junction back surface field which reduces recombination and benefits the export of photoelectric signals. That means the light receiving region at the same surface of the electric circuit does not have a depletion region that helps photoelectric signal collection. In the present embodiment, the depletion region that helps photoelectric signal collection locates at the back side which is the different surface of the electric circuit, and the depletion region is provided by the heterojunction photodetector formed by transparent conductive layer and N type silicon substrate.

In the present embodiment, it is also different from prior art that when electric circuit is manufactured, the back-surface passivation field 14 (as in FIG. 2b) that is at the first surface 20 of the first substrate 10, is heavily doped (for example, about $1 \times 10^{18-20}$ $cm^{-3}$) with the same doping type of the first substrate 10. The back-surface passivation field is a potential well to help collect photoelectric signal and reduce the recombination of photogenerated carriers at the first surface 20. The back surface field 14 can be implemented by techniques well-known in the art, including but not limited to ion implantation, high temperature annealing, high temperature diffusion, doped layer deposition, passivation layer formation, etc., preferably ion implantation and high temperature annealing.

Figure 2D:
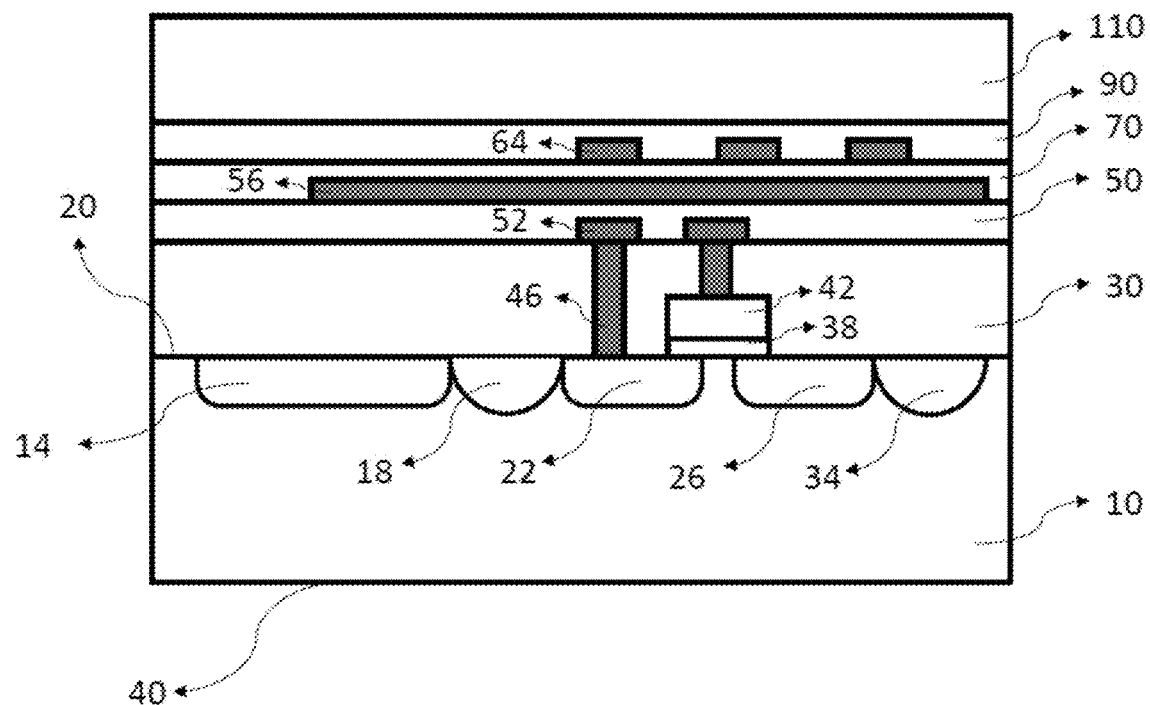
Figure 2E:
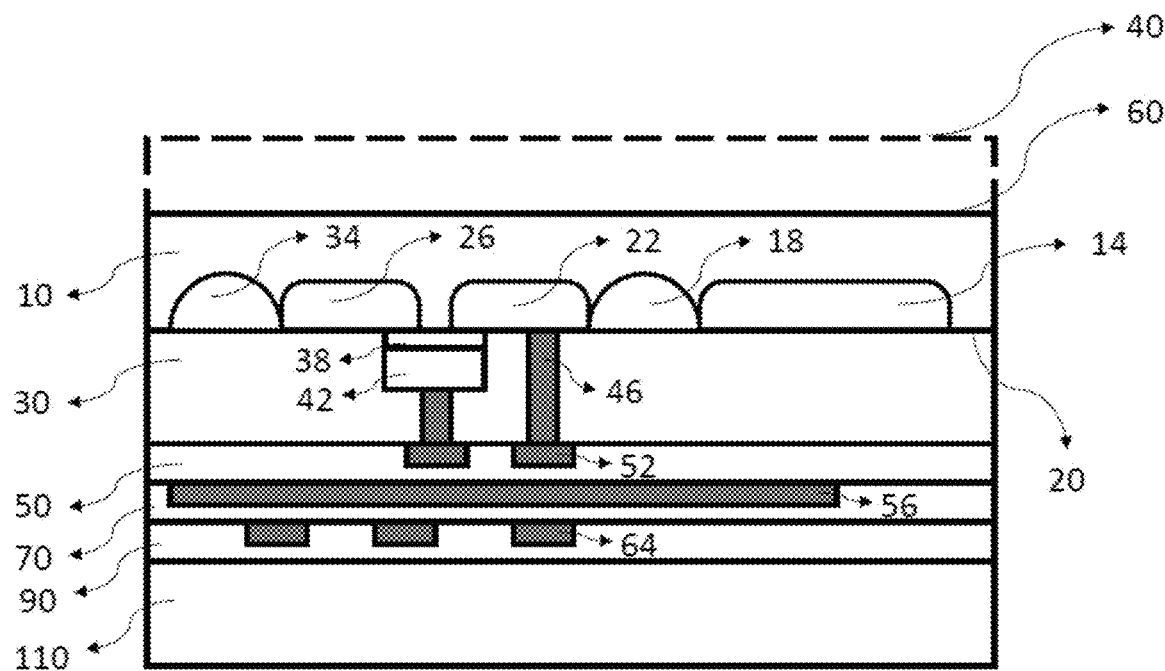
Figure 2F:
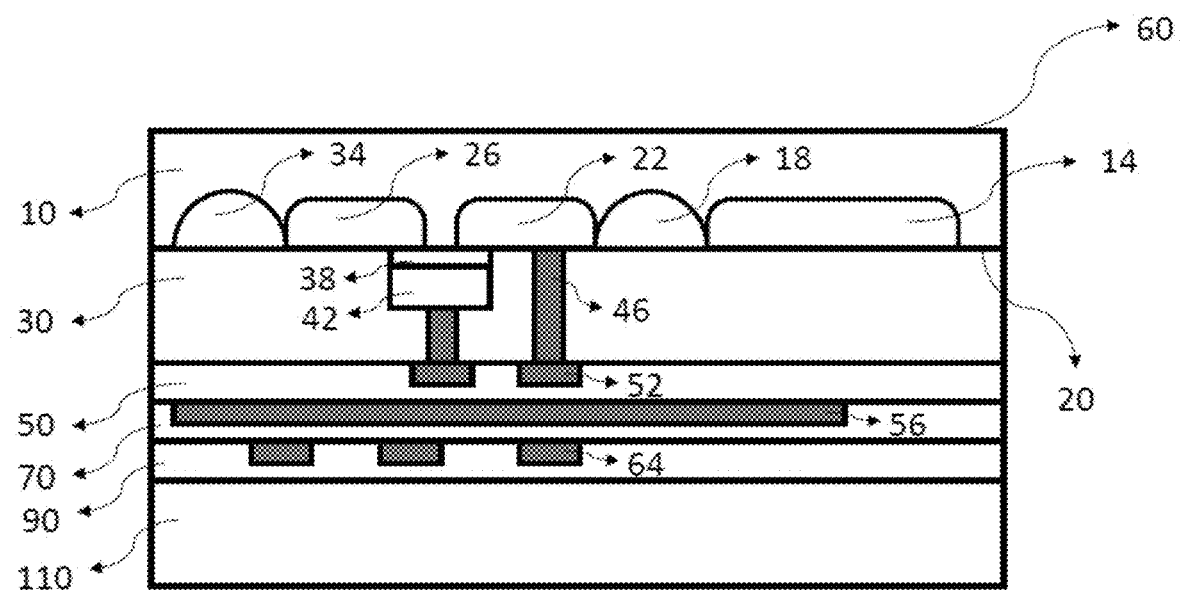

In the present embodiment, after the manufacture of the surface with the electric circuit part, the silicon wafer is connected to the support substrate, that is, to the second substrate 110 (as illustrated in FIG. 2d) by well-known methods in the art such as align key, so that the back surface of the first substrate 10 (i.e. the original second surface 40) is easy to process. As illustrated in FIG. 2e, from the back surface of the first substrate 10, the first substrate 10 for several hundred micrometers (for example, 100 μm, 200 μm, 500 μm) in thickness is etched using a chemical method, a mechanical method, or a chemical and mechanical hybrid method to about 2 μm to 200 μm (e.g. about 10 μm, 20 μm, 30 μm, 50 μm, or 100 μm), preferably 20 μm to 80 μm, or no etching. As illustrated in FIG. 2e, the original second surface 40 of the first substrate 10 is etched to form an etched second surface 60, and after etching, as illustrated in FIG. 2f, the first substrate 10 is the substrate having a thickness of from the etched second surface 60 to the first surface 20.

It should be noted here that in traditional PN junction photodetector based backside illuminated image sensor, the PN junction photodetector creates a depletion region (the high-efficiency photogenerated carrier collection region), the depletion region is not overlapped with the high efficiency photon absorption region that is adjacent to the transparent conductive layer, thus the substrate etching process or the utilization of special substrate (such as Silicon on Insulator (SOI) substrate) are necessary so that the high efficiency photon absorption region and the depletion region can come close or even overlap partly. Therefore, in traditional technologies, the first substrate 10 thickness after etching is typically below 10 μm, in some cases 2 μm to 3 μm, so that the high efficiency photon absorption region and the depletion region (the high-efficiency photogenerated carrier collection region) can overlap. However, the substrate etching process is very difficult with a very low yield. Under the same tolerance, the low substrate thickness amplifies the performance difference caused by the tolerance; the utilization of specific substrate is expensive.

To improve the issues mentioned above, a heterojunction photodetector based backside illuminated image sensor in the present invention, wherein the heterojunction is formed by a transparent conductive layer and the first substrate 10 (for example an N type silicon substrate), and then the formed depletion region, that helps collect photogenerated carriers, locates at the back side that is the different surface from the electric circuit and overlaps with the high efficiency photon absorption region. Therefore, in embodiments of the present invention, the first substrate 10 does not require substrate etching process or only require slight substrate etching process, which reduces difficulty of manufacture and improves production yield. In the meantime, the overlap between high efficiency photon absorption region and depletion region (the high-efficiency photogenerated carrier collection region) can improve quantum conversion efficiency to a certain extent.

Moreover, the first substrate 10 with certain thickness can also reduce the noise caused by semiconductor surface defects and facilitate light absorption. If the substrate thickness is very thin (for example below 10 μm or even 2 μm 3 μm), the absorption of near infrared light with a longer wavelength is strongly affected, therefore this kind of the image sensor suffers from very low sensitivity for near infrared light, this is because the penetration depth of near infrared light is much longer than that of visible light, most of near infrared photons penetrate through the photosensitive region and cannot be captured. For example, the penetration depth for near infrared light with 940 nm wavelength in the silicon substrate is approximately 100 μm. In some circumstance, for example choosing the substrate thickness of 100 μm, the substrate etching process can be eliminated, thus the first substrate that has not been etched will have better absorption of near-infrared light with a fixed wavelength. In typical cases, as for near-infrared light with 860 nm, the first substrate thickness is preferred to be approximately 20 μm to 80 μm.

Figure 2G:
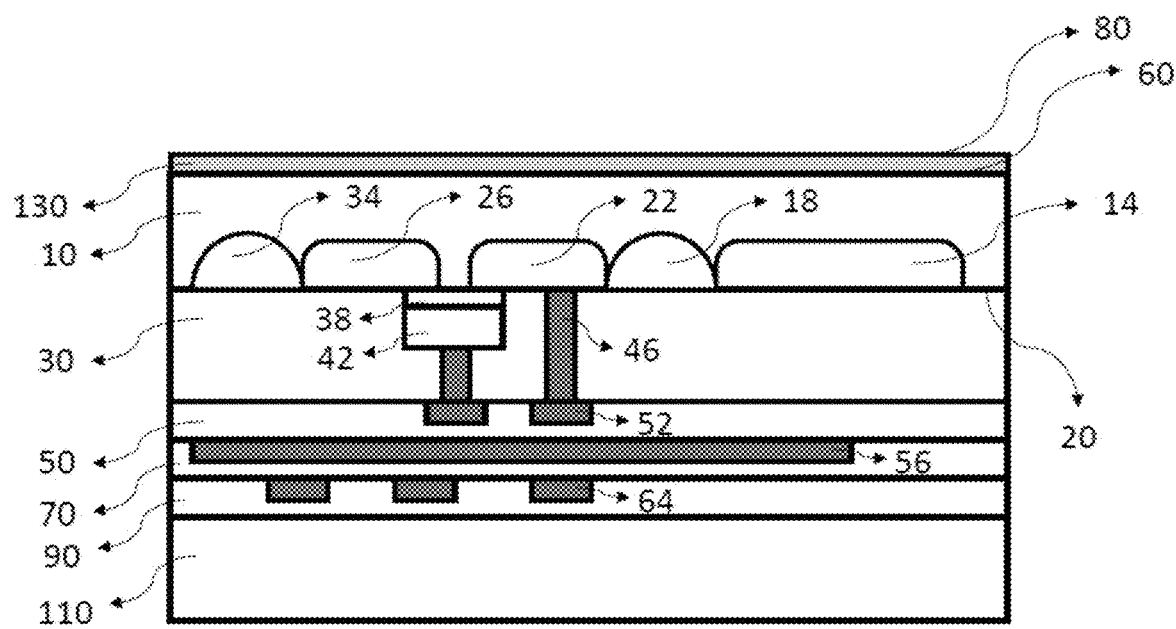

Subsequently, as illustrated in FIG. 2g, after standard surface cleaning, the transparent conductive layer is made on the etched second surface 60 of the first substrate by techniques well-known in the art including: physical deposition; chemical deposition, such as low-pressure chemical vapor deposition (LPCVD); plasma deposition, such as plasma enhanced chemical vapor deposition (PECVD); combined deposition of physical and chemical deposition; pulsed laser deposition; solution deposition; sputtering deposition, such as direct current sputtering and radio frequency sputtering; e-beam evaporation; thermal evaporation. In addition, the transparent conductive layer (130) is formed by materials selected from a group consisting of but not limited to Indium Tin Oxide (ITO), Zinc Oxide (ZnO), doped Zinc Oxide (doped ZnO). In the present embodiment, the transparent conductive film 130 is achieved with aluminum-doped zinc oxide (Al—ZnO) deposited by radio frequency sputtering.

In order to improve the optical anti-reflection property for the different targeted wavelength light, it can be achieved by adjusting the thickness of the transparent conductive layer 130 (i.e. the transparent conductive layer not only forms the heterojunction photodetector, but also realizes or assists the realization of the function of Anti-Reflection Coating layer). The thickness of the transparent conductive layer 130 is about 10 nm to 500 nm, for example about 20 nm, 50 nm, 80 nm, 100 nm, 200 nm, 500 nm. In the present embodiment the thickness of the transparent conductive layer 130 is about 80 nm. The thickness is designed based on the refractive index of the transparent conductive layer and the targeted light wavelength, and this design is targeted for 600 nm red visible light.

It should be noted that, optimization approach is adopted in the present embodiment, that is the transparent conductive layer 130 serves as single layer Anti-Reflection Coating layer to achieve anti-reflection function, and therefore simplifying the manufacturing process for Anti-Reflection Coating layer, eliminating the step of manufacture Anti-Reflection Coating layer separately in the prior art. In other embodiment, the transparent conductive layer 130 can serve as one layer of multi-layer Anti-Reflection Coating layer to achieve the anti-reflection property with other Anti-Reflection Coating layer.

Figure 2H:
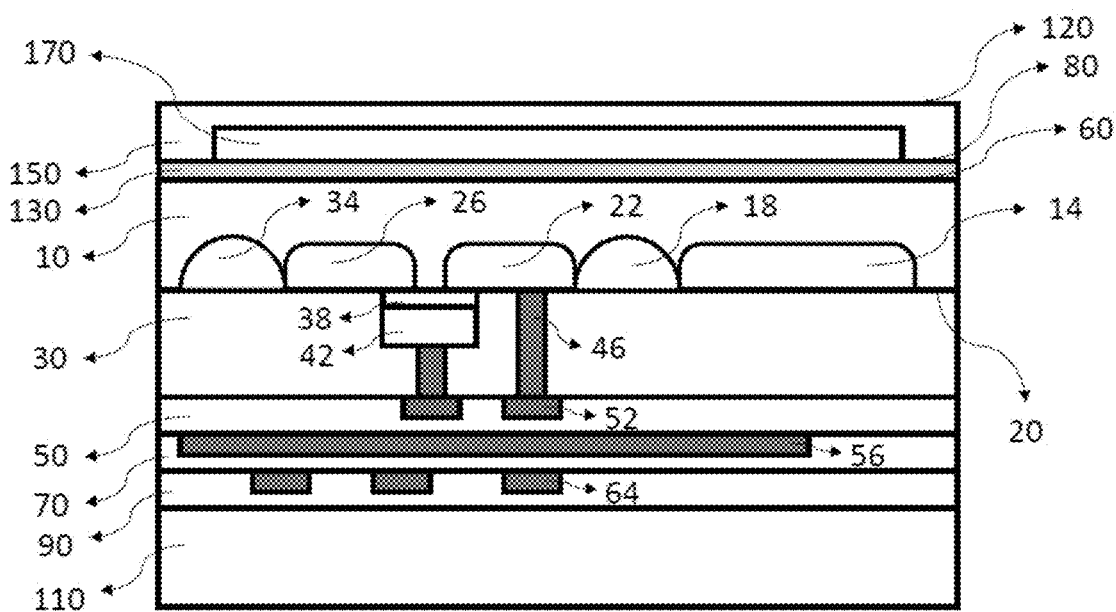
Figure 2I:
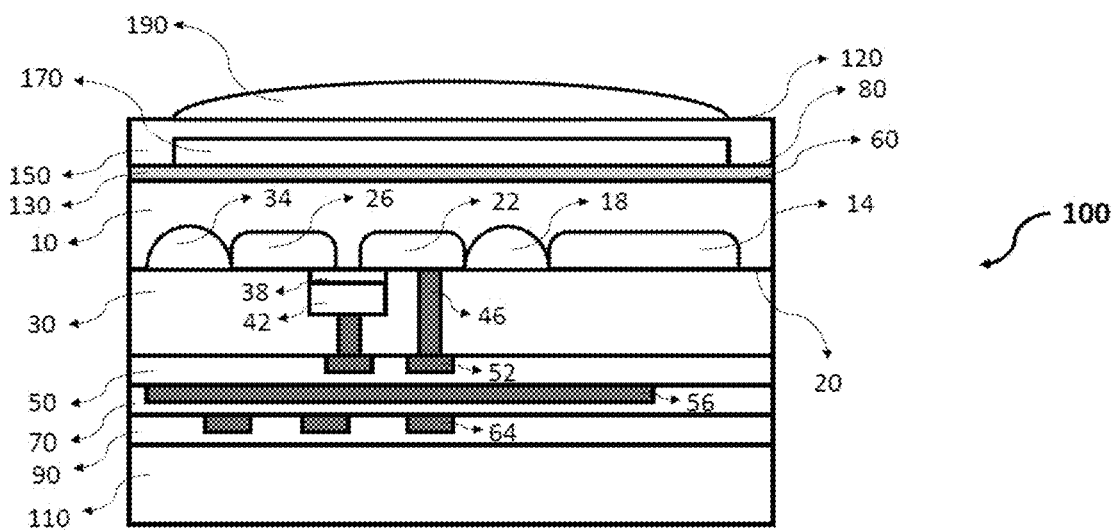

After the manufacture of the transparent conductive layer 130, a smoothing layer 150 is formed using well-known techniques in the art on the upper surface 80 of the transparent conductive layer to smooth the surface and benefit the manufacture of microlens as shown in FIG. 2h. An optical filter 170 is formed in the smoothing layer 150 on the upper surface 80 of the transparent conductive layer. Subsequently, as illustrated in FIG. 2i, an optical microlens 190 is manufactured on the upper surface 120 of the smoothing layer 150, using well-known techniques in the art, and finally complete the manufacture of the image sensor.

In comparison to prior art, because the PN junction is formed through high temperature process, the electric circuit and the photodetector have to be manufactured together at the same time, otherwise, the high temperature manufacture process of the PN junction will change the finished electric circuit part, thus the manufacture of the electric circuit part and the photodetector part cannot be optimized separately. While the formation of the heterojunction in the present invention can be manufactured through low temperature (below 250° C.) process, therefore the manufacture of the heterojunction does not affect the finished electric circuit part, as a result of that, the photodetector can be manufactured after the electric circuit part is optimized and manufactured so that the photodetector and the electric circuit can both be optimized separately. That is to say, in the embodiments, the photodetector can be manufactured last after the manufacture and optimization of the electric circuit part, because the low temperature fabrication process of the heterojunction does not affect finished electric circuit part.

Figure 3:
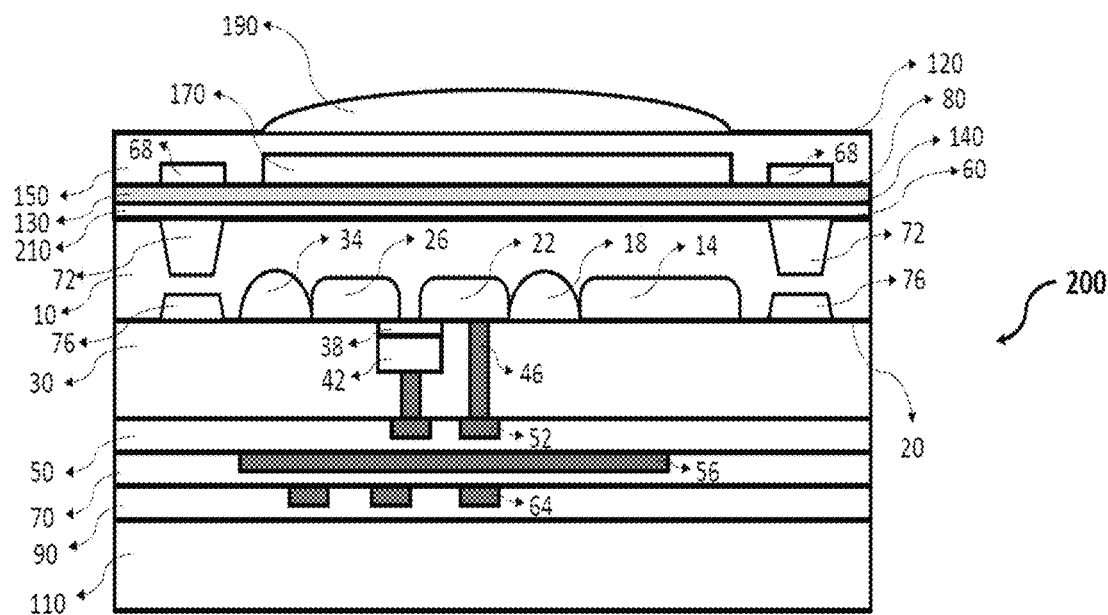
FIG. 3 is a cross-sectional view illustrating a backside illuminated image sensor in accordance with a second embodiment of the present invention.

FIG. 3 illustrates a cross-sectional view of a second embodiment of the back side illuminated image sensor of the present invention, wherein the reference numeral "200" represents a pixel unit of the heterojunction photodetector based backside illuminated image sensor. In the embodiment, referring to FIG. 3, the pixel unit 200 has a structure similar to that of the first embodiment shown in FIG. 1. The parts that are the same as relevant parts in the first embodiment, are not repeated here, please refer to the description of the relevant parts of the first embodiment. The differences are as follows: a passivation layer 210 is disposed between the first substrate 10 and the transparent conductive layer 130; a light shield 68 is disposed on the upper surface 80 of the transparent conductive layer 130 and surrounds the light filter; a second-surface inter-pixel isolation region 72 is disposed in the first substrate 10 at the second surface 60 of the first substrate and region 72 is disposed in a way to correspond to the light shield 68; a first-surface inter-pixel isolation region 76 is disposed in the first substrate 10 at the first surface 20 of the first substrate 10 and region 76 is disposed in a way to correspond to the light shield 68 and the second-surface inter-pixel isolation region 72. The depth ratio of the inter-pixel isolation regions 72 and 76 in FIG. 3 is for illustrative purposes. The actual ratio may change, and the two may even merge into the same penetration isolation region.

Figure 4A:
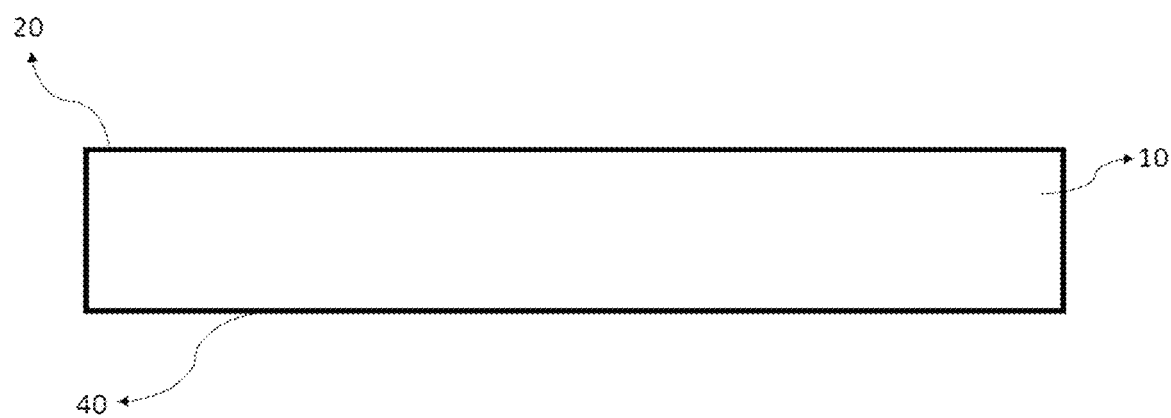
FIGS. 4a to 4j illustrates a method of manufacturing a backside illuminated image sensor in accordance with the second embodiment of the present invention.
Figure 4B:
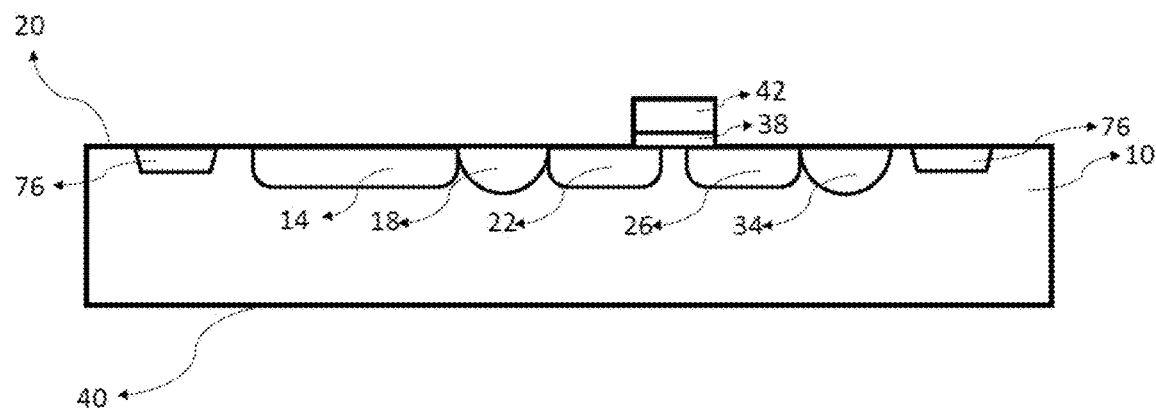
Figure 4C:
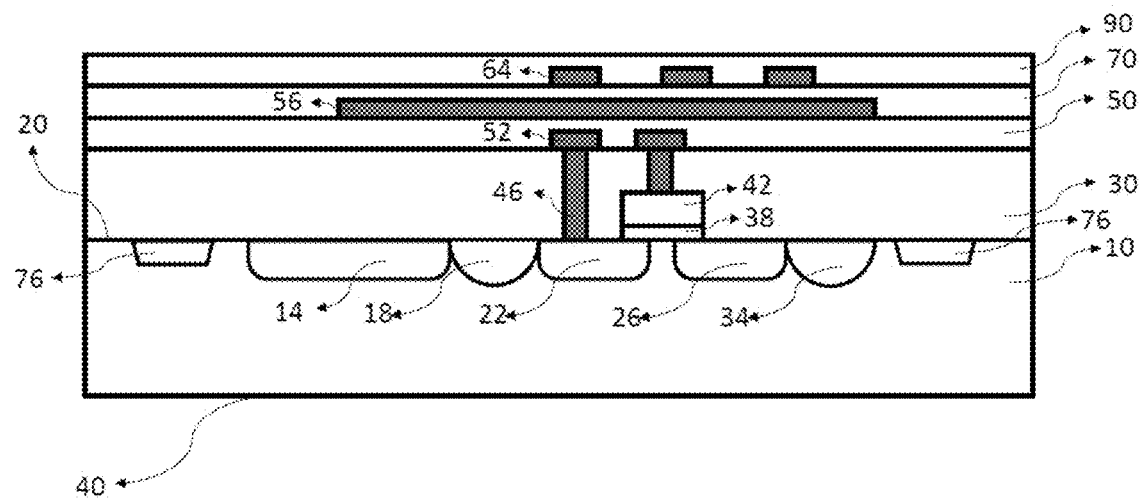
Figure 4D:
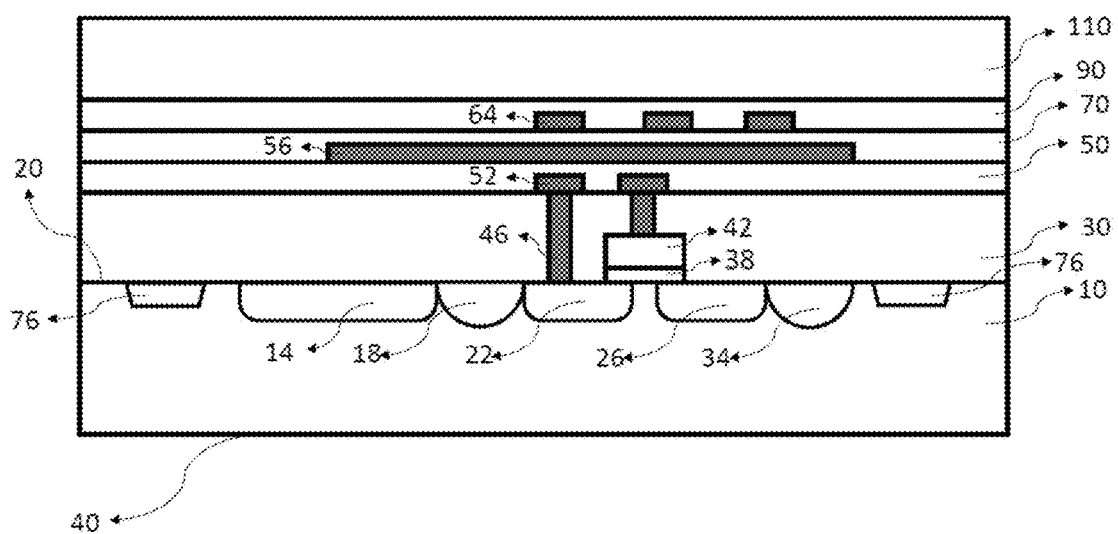
Figure 4E:
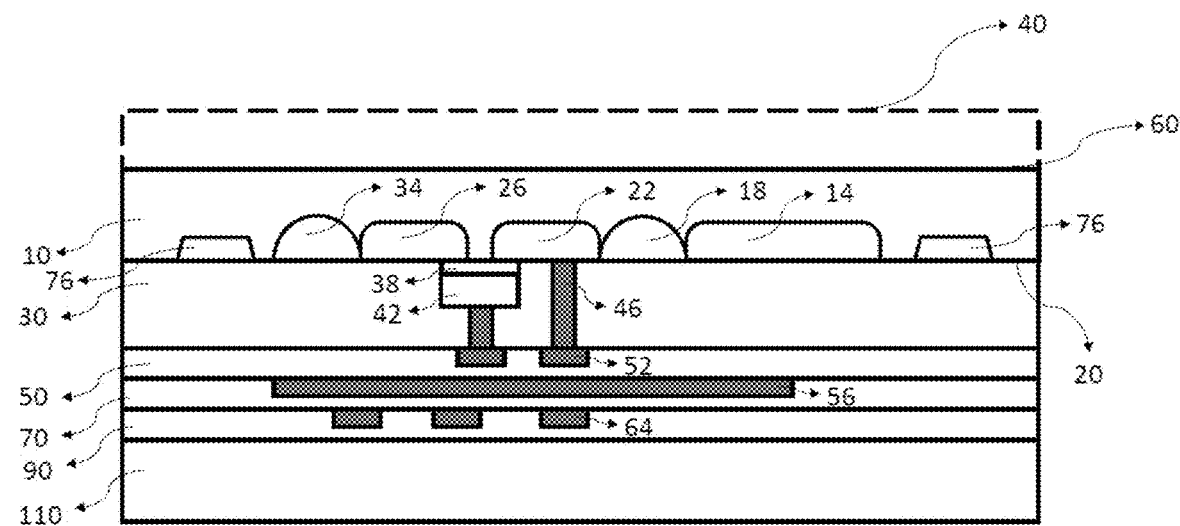
Figure 4F:
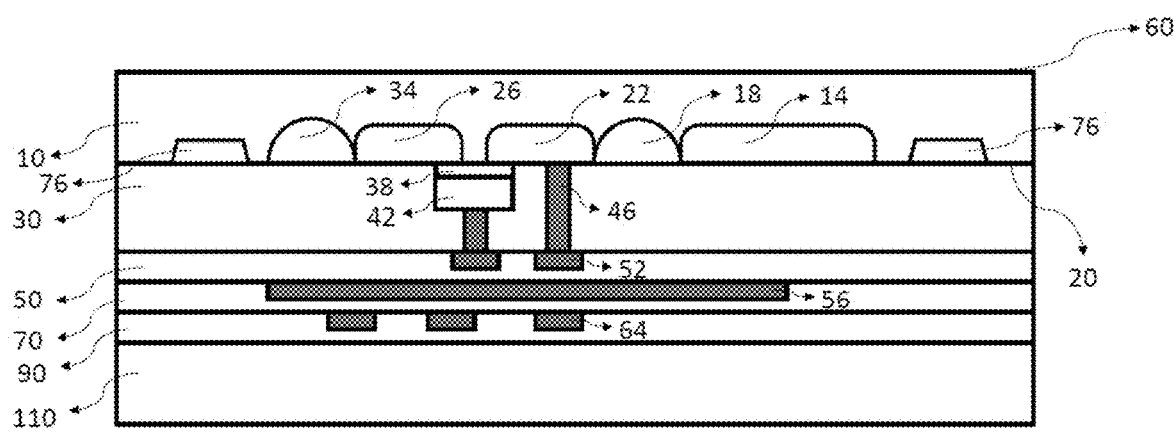
Figure 4G:
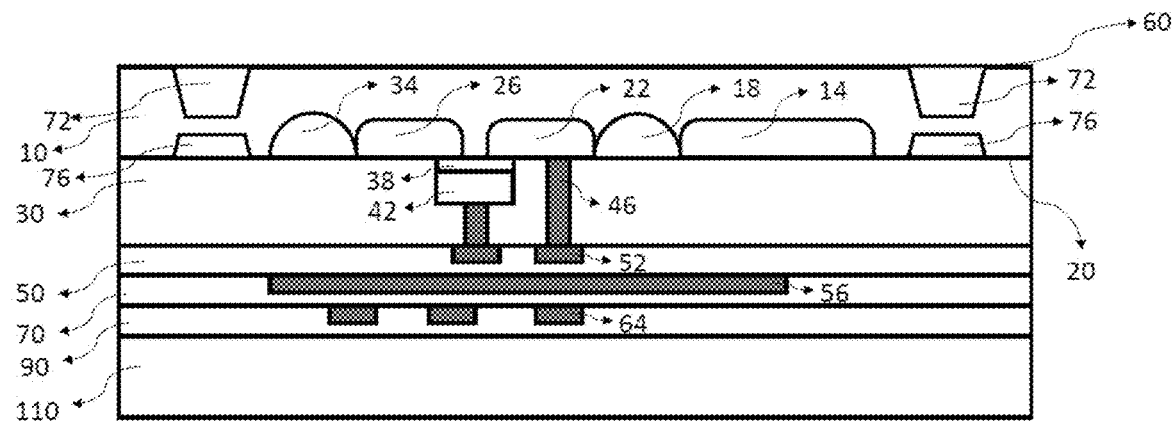

FIG. 4a to 4j illustrate the manufacture process of the second embodiment of the backside illuminated image sensor of the present invention. The manufacture process is similar to that of the first embodiment described above. The manufacture process that are the same as relevant manufacture process in the first embodiment, are not repeated here, please refer to the description of the relevant manufacture process of the first embodiment. The differences are as follows: as illustrated in FIG. 4b, when preparing the electric circuit, the first-surface inter-pixel isolation region 76 disposed on the first surface 20 of the first substrate 10 is made; the isolation region 76 is close to the edge of first substrate 10 and is surrounding the first isolation layer 18, the source and drain electrodes 22, 26 of the transistors in the pixel control and reading circuit and the second isolation layer 34; after obtaining the etched second surface 60 of the first substrate 10, as illustrated in FIG. 4g, on which the second-surface inter-pixel isolation region 72 is disposed in the first substrate 10, and the second-surface inter-pixel isolation region 72 corresponds to the first-surface inter-pixel isolation region 76. The depth ratio of the inter-pixel isolation regions 72 and 76 is for illustrative, purposes. The actual ratio may change, and the two may even merge into the same penetration isolation region.

Figure 4H:
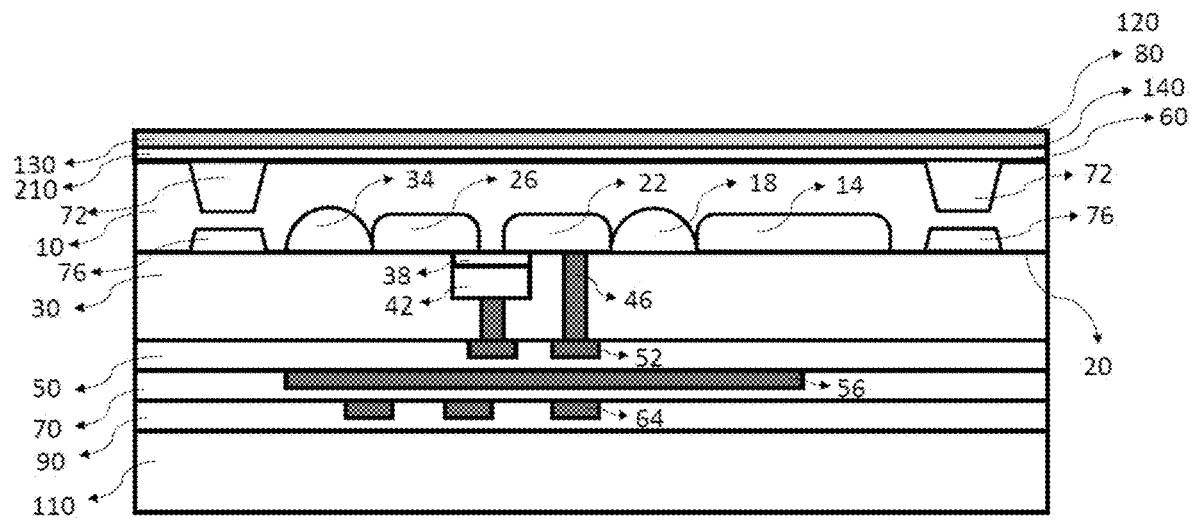

The differences also include: as illustrated in FIG. 4h, after standard surface cleaning, a passivation layer 210 is made on the etched second surface 60 of the first substrate 10 by techniques well-known in the art including but not limited to: physical deposition; chemical deposition, such as low pressure chemical vapor deposition (LPCVD); plasma deposition, such as plasma enhanced chemical vapor deposition (PECVD); combined physical and chemical deposition; pulsed laser deposition; thermal evaporation; e-beam evaporation; sputtering, such as direct current sputtering and radio frequency sputtering; atomic alignment; wet oxidation; dry oxidation; chemical solution oxidation. The passivation layer 210 may be composed of multiple sub-layers having the same or different materials, structures, and compositions in order to passivate the junction interface (i.e. the etched second surface 60 of the first substrate 10) and/or enhance the depletion region, and therefore, optimize the performance of the photodetector.

The passivation layer 210 can be formed by wide bandgap material, narrow bandgap material, bandgap engineered material, crystalline material, amorphous material, microstructured material, nano-structured material, intrinsic material, hybrid material, alloy material, doped material. In some embodiments, the passivation layer 210 can be formed on the first substrate 10 through oxidation, etching, passivation, doping, polishing, texturing and like.

The passivation layer 210 is formed to have a thickness of 0.5 nm to 10 nm, in preferred embodiments, the passivation layer is formed to have a thickness of 2 nm to 3 nm. In some embodiments, the passivation layer 210 is formed to have a thickness of 10 nm to 500 nm; in preferred embodiments, the passivation layer is formed to have a thickness of 50 to 100 nm. In some implementations, the passivation layer 210 with 10 nm to 500 nm thickness has lower noise comparing to the passivation layer with 0.5 nm to 10 nm thickness, while the passivation layer with 0.5 nm to 10 nm thickness provides better quantum conversion efficiency, response speed, etc. comparing to the passivation layer with 10 nm to 500 nm thickness. Therefore, in different application scenarios, the thickness of passivation layer can be optimized in different ways according to different needs.

In the present embodiment, the passivation layer 210 is achieved by forming a silicon dioxide layer of approximately 2 nm to 3 nm by chemical solution (Nitric acid solution) oxidation.

Subsequently, as illustrated in FIG. 4h, a transparent conductive layer 130 is made on the passivation layer 210 through well-known techniques in the art. The manufacture process and property of the transparent conductive layer 130 is the same as that of the transparent conductive layer 130 made on the etched second surface 60 of the first substrate in the first embodiment as described above. That is to say, the transparent conductive layer 130 in the present embodiment can be used not only to generate a heterojunction but also as an Anti-Reflection Coating layer. For a detailed description, please refer to the description of the transparent conductive layer 130 in the first embodiment, the description is not repeated here.

Figure 4I:
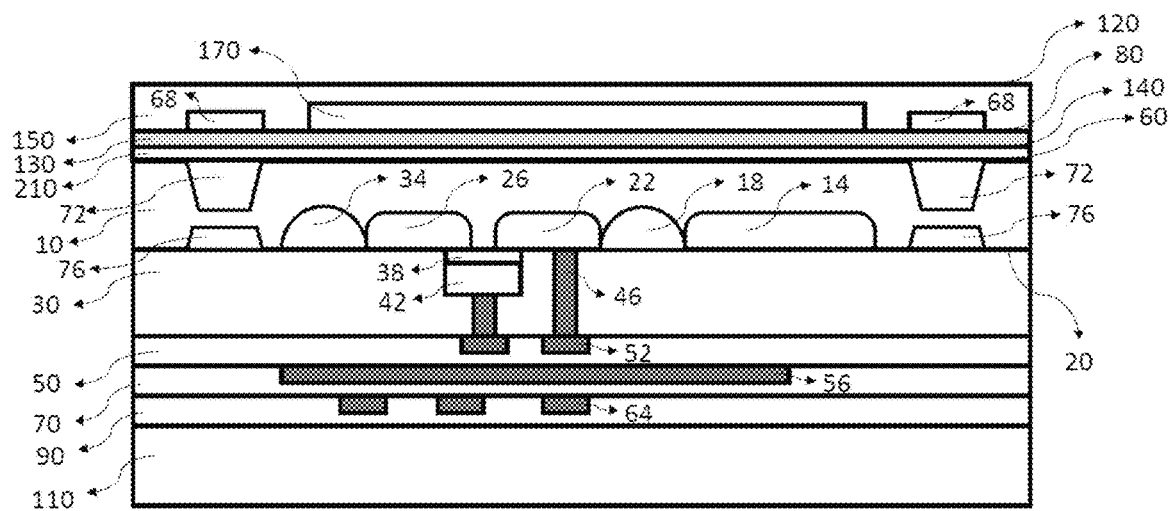
Figure 4J:
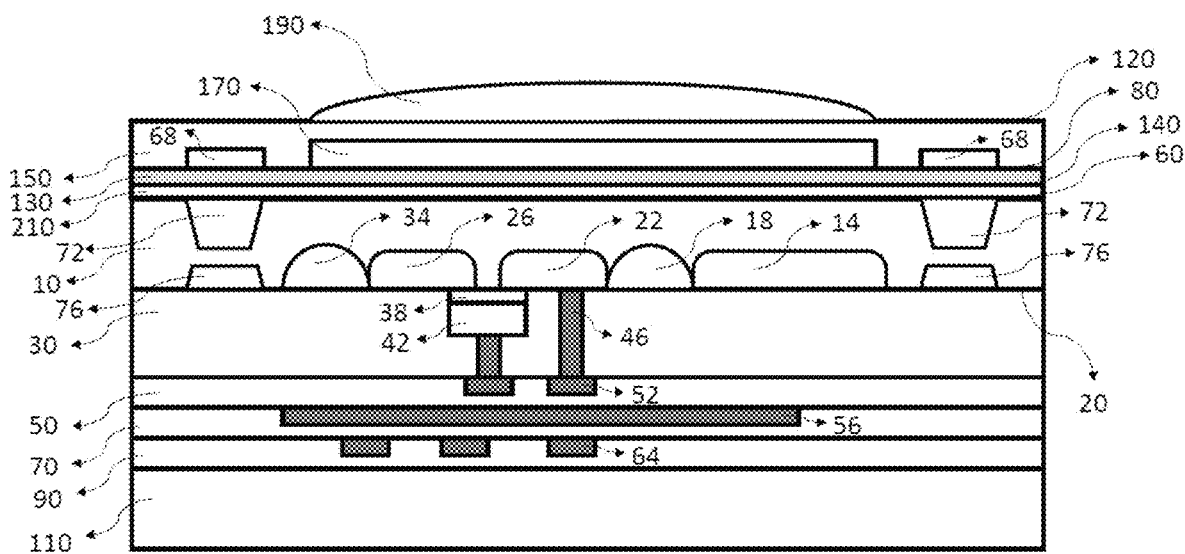

After the manufacture of the transparent conductive layer 130, a smoothing layer 150 is formed using well-known techniques in the art on the upper surface 80 of the transparent conductive layer 130 to make the surface smooth and benefit the manufacture of microlens as illustrated in FIG. 4i. In the meantime, optical filter 170 and light shield 68 are manufactured in the smoothing layer 150 at the upper surface 80 of the transparent conductive layer. The light shield 68 is disposed on the upper surface 80 of the transparent conductive layer 130 and surrounds the light filter. Subsequently, as illustrated in FIG. 4j, an optical microlens 190 is manufactured on the upper surface 120 of the smoothing layer 150, using well-known techniques in the art and finally finish the manufacture of the image sensor.

In the present embodiment, the light shield 68, the first-surface inter-pixel isolation region 76 and the second-surface inter-pixel isolation region 72 are well-known parts in the art, the main function of introducing the parts into the present embodiment is to enhance the performance of the backside illuminated image sensor illustrated in the present embodiment, which may be omitted in other embodiments.

Similar to the first embodiment, in comparison to prior art, because the PN junction in the prior art is formed through high temperature process, the electric circuit and the photodetector have to be manufactured together at the same time, otherwise, the high temperature manufacture process of the PN junction will change die finished electric circuit part, thus the manufacture process of the electric circuit part and the photodetector part cannot be optimized separately. While the formation of the heterojunction in the present invention can be manufactured through low temperature (below 250° C.) process, therefore the manufacture of the heterojunction does not affect the finished electric circuit part, as a result of that, the photodetector can be manufactured after the electric circuit part is optimized and manufactured so that the photodetector and the electric circuit can both be optimized separately. That is to say, in the embodiments, the photodetector can be manufactured last, after the manufacture and optimization of the electric circuit part, because the low temperature fabrication process of the heterojunction does not affect the finished electric circuit part.

In addition, in the prior art, some backside illuminated image sensors manufacture the passivation layer on the back surface, the anti-reflection layer and the transparent conductive layer to apply a back side reverse bias voltage, thereby reducing the free carrier recombination at the back side and improving quantum conversion efficiency. The structure of the present embodiment seems similar to this structure, but the actual structure and application purpose are significantly different. First, in terms of the property of the passivation layer, the passivation layer in the prior art is insulative, and provides capacitance; the passivation layer achieves surface recombination reduction through repelling the minority carriers. In comparison, the passivation layer 210 of this structure in the present invention is conductive through tunneling current and other mechanisms. Second, in terms of the thickness of the passivation layer, the thickness of the passivation layer in the prior art is several hundreds of nanometers to several micrometers. In comparison, the passivation layer 210 in the present invention, is several nanometers to several hundreds of nanometers. In foreseeable embodiments, the thickness of the passivation layer is about 0.5 nm to 10 nm. In preferred embodiments, the thickness of the passivation layer is about 2 nm to 3 nm. The passivation layer in the present invention has the ultra-thin and tunneling property, and such type of passivation layer can improve the overall performance of the backside illuminated image sensor, help increase the quantum conversion efficiency and photoresponsivity of the photodetector. In other foreseeable embodiments, the thickness of the passivation can be 10 nm to 500 nm In preferred embodiments, the thickness of the passivation layer is 50 nm to 100 nm. In an implementation, the passivation layer with 10 nm to 500 nm thickness has lower noise comparing to the passivation layer with 0.5 nm to 10 nm thickness, while the passivation layer with 0.5 nm to 10 nm thickness provides better quantum efficiency, response speed, etc. comparing to the passivation layer with 10 nm to 500 nm thickness. Therefore, in different application scenarios, the thickness of passivation layer can be optimized in different ways according to different needs.

The invention claimed is:

1. A backside illuminated image sensor, comprising a photodetector part and an electric circuit part, wherein the photodetector part comprises:
   a microlens and a light filter, allowing incoming photons to travel through the microlens and then through the light filter to enter into the backside illuminated image sensor;
   a transparent conductive layer disposed beneath the microlens and the light filter, and allowing the incoming photons continue to travel through the transparent conductive layer; and
   a first substrate disposed beneath the transparent conductive layer, and configured to capture and detect the received photons;
   wherein the first substrate is a silicon substrate and comprises a first surface and an opposing second surface, the electric circuit part is formed from the first surface, and the photodetector part is formed from the second surface;
   wherein in the photodetector part, the transparent conductive layer and the first substrate form a heterojunction structure configured to collect free carriers generated by photogenerated conversion and form photoelectric signals.

2. The backside illuminated image sensor according to claim 1, wherein the transparent conductive layer is in direct contact with the first substrate, and a contact region between the transparent conductive layer and the first substrate forms a depletion region of the heterojunction structure.

3. The backside illuminated image sensor according to claim 1, wherein the photodetector part further comprises a passivation layer disposed between the transparent conductive layer and the first substrate, at the second surface of the first substrate; wherein the passivation layer is formed to be conductive.

4. The backside illuminated image sensor according to claim 1, wherein the photodetector part further comprises a passivation layer disposed between the transparent conductive layer and the first substrate, at the second surface of the first substrate; the passivation layer is made of insulating material, but the passivation layer is non-conductive horizontally and conductive vertically, through tunneling effect or structural defects, to achieve electrical current conduction.

5. The backside illuminated image sensor according to claim 3, wherein the passivation layer is formed to have a thickness of 0.5 nm to 10 nm.

6. The backside illuminated image sensor according to claim 3, wherein the passivation layer is formed to have a thickness of 10 nm to 500 nm.

7. The backside illuminated image sensor according to claim 3, wherein the passivation layer is formed by wide bandgap material, narrow bandgap material, bandgap engineered material.

8. The backside illuminated image sensor according to claim 1, wherein the first substrate is lightly doped N-type silicon substrate.

9. The backside illuminated image sensor according to claim 1, wherein the first substrate is formed to have a thickness of 2 µm to 200 µm; and/or the transparent conductive layer is formed to have a thickness of 10 nm to 500 nm.

10. The backside illuminated image sensor according to claim 1, wherein the transparent conductive layer is formed by materials selected from a group consisting of Indium Tin Oxide (ITO), Zinc Oxide (ZnO), doped Zinc Oxide (doped ZnO), Indium Oxide ($In_2O_3$), Tin Oxide ($SnO_2$).

11. The backside illuminated image sensor according to claim 1, wherein the photodetector part comprises an anti-reflection coating layer, the transparent conductive layer is capable to work together with the anti-reflection coating layer to selectively reduce reflection of incoming photons with one or more predetermined wavelengths.

12. The backside illuminated image sensor according to claim 1, wherein the electric circuit part further comprises a back surface field, the back surface field is positioned at the first surface of the first substrate, and the back surface field is a heavily doped region, and the back surface field has the same doping type as the first substrate.

13. The backside illuminated image sensor according to claim 1, wherein the electric circuit part comprises source and drain electrodes of a transistor in a pixel control and reading circuit, and the source and drain electrodes are directly formed on the first surface of the first substrate.

14. A method of manufacturing the backside illuminated image sensor according to claim 1, the method comprising:
   providing the first substrate;
   forming the electric circuit part from the first surface of the first substrate; and
   forming the photodetector part from the second surface of the first substrate, wherein the forming the photodetector part further comprises:
   forming the transparent conductive layer at the second surface side of the first substrate, such that the transparent conductive layer and the first substrate form a heterojunction structure configured to collect free carriers generated by photogenerated conversion and form photoelectric signals; and
   sequentially forming the light filter and the microlens on the transparent conductive layer.

15. The method according to claim 14, wherein the forming the transparent conductive layer at the second surface side of the first substrate comprises: forming the transparent conductive layer directly on the second surface of the first substrate.

16. The method according to claim 14, wherein the forming the transparent conductive layer at the second surface side of the first substrate sequentially comprises:
- forming a passivation layer on the second surface of the first substrate; and
- forming the transparent conductive layer on the passivation layer;
- wherein the passivation layer is formed to be conductive.

17. The method according to claim 14, wherein the forming of the photodetector part is performed below 250° C.

18. The method according to claim 14, further comprising:
- forming a back surface field at the first surface of the first substrate, wherein the back surface field is a heavily doped region and has the same doping type as the first substrate.

19. The method according to claim 14, wherein the forming the electric circuit part from the first surface of the first substrate sequentially comprises:
- forming a first isolation layer, source and drain electrodes of a transistor in a pixel control and readout circuit and a second isolation layer in the first substrate;
- forming first to fourth insulating interlayers on the first substrate, forming a gate insulating layer and a gate conducting layer of the transistors in the pixel control and readout circuits in a first insulating interlayer, and forming conductive interlayers that are disposed in the first to fourth insulating interlayers respectively;
- forming a second substrate adjacent to the fourth insulating interlayer.

20. The backside illuminated image sensor according to claim 1, wherein a depletion region is formed at an interface of the heterojunction structure to collect the free carriers generated by photogenerated conversion and form the photoelectric signal, such that a region with high efficiency light absorption and a region with high efficiency collection of free carriers are coincided at the second surface of the first substrate.

* * * * *